United States Patent [19]

Hobgood et al.

[11] Patent Number: 4,594,173

[45] Date of Patent: Jun. 10, 1986

[54] INDIUM DOPED GALLIUM ARSENIDE CRYSTALS AND METHOD OF PREPARATION

[75] Inventors: Hudson M. Hobgood; Richard N. Thomas, both of Murrysville; Donovan L. Barrett, Pittsburgh, all of Pa.

[73] Assignee: Westinghouse Electric Corp., Pittsburgh, Pa.

[21] Appl. No.: 602,236

[22] Filed: Apr. 19, 1984

[51] Int. Cl.⁴ .................. C30B 15/04; H01L 29/14
[52] U.S. Cl. ............................. 252/62.3 GA; 156/607; 156/617 SP; 156/DIG. 70; 156/605
[58] Field of Search ............ 156/605, 616 A, 617 SP, 156/607, DIG. 70; 252/62.3 GA

[56] References Cited

U.S. PATENT DOCUMENTS 3,401,023  9/1968  Mullin .............................. 156/607
3,741,817  6/1973  Bienert et al. ..................... 156/607
4,190,486  2/1980  Kyle ............................ 156/DIG. 73

FOREIGN PATENT DOCUMENTS 2108404  9/1984  United Kingdom .

OTHER PUBLICATIONS

Utech et al., "Elimination of Solute Banding in Indium Antimonide Crystals by Growth in a Magnetic Field" *J. of Applied Physics*, v. 37, No. 9, (1966).
Terashima et al., "Electrical Resistivity of Undoped GaAs Single Crystals Grown by Magnetic Field Applied LEC Technique" *Jap. J. of Applied Physics*, v. 22, No. 6, (1983).
Nanishi et al., "Correlation Between Dislocation Distribution and FET Perf. Observed in Low Cr Doped LEC GaAs", *Jap. J. of Applied Physics*, v. 22, No. 1, (1983).
Miyazawa, "Leakage Current $I_L$ Variation Correlated with Dislocation Density in Undoped, Semi-Insulating LEC-GaAs" *Jap. J. of Applied Physics*, v. 21, No. 9, (1982).
J. Wagner, Preparation and Properties of Bulk $In_{1-x}Ga_xAs$ Alloys, Journal of Electrochemical Society Solid State Science, Sep. 1970, pp. 1194–1196.

*Primary Examiner*—David L. Lacey
*Attorney, Agent, or Firm*—W. G. Sutcliff

[57] ABSTRACT

A method of fabrication of low dislocation single crystal indium-doped gallium arsenide, and improved crystal structure. The method is an improved liquid encapsulant Czochralski process with an indium doping level of $5 \times 10^{19}$ to $3 \times 10^{20}$ indium atoms per cubic centimeter incorporated into the large diameter, long single crystal. The initial melt of elemental indium, gallium, and arsenic contain about 1 atom percent of indium, and inclusion of the indium permits high yield growth of crystals with desired near stoichiometric or slightly arsenic rich composition which exhibit the desired electrical characteristics.

6 Claims, 6 Drawing Figures

INDIUM DOPED GALLIUM ARSENIDE CRYSTALS AND METHOD OF PREPARATION

The Government has rights in this invention pursuant to Contract No. F33601-83-C-0076.

BACKGROUND OF THE INVENTION

The present invention relates to semi-insulating gallium arsenide single crystal material and methods of fabrication which produce a crystal structure exhibiting a low dislocation density.

While silicon remains the primary semiconductor substrate material for commercial integrated circuit technology, gallium arsenide substrates exhibit electrical characteristics which permit improved integrated circuit device capability. The areas of gallium arsenide development have centered on improvements in crystal purity, dislocation density, and uniformity which are necessary for widespread, reasonable cost usage of gallium arsenide in commercial integrated circuit fabrication.

Gallium arsenide single crystals have been fabricated using conventional liquid encapsulation Czochralski growth technique. The gallium and arsenic are disposed in a refractory crucible and thermally melted, with the melt being covered with liquid boric oxide with a high inert gas pressure maintained in the system. The liquid boric oxide and high pressure served to impede volatilizaion of the arsenic from the melt. Such crystal growth techniques are shown in Great Britain Patent Application No. 2,108,404 published May 18, 1983, and in the article entitled "Preparation and Properties of Bulk $In_{1-x}Ga_xAs$ Alloys," by J. Wagner, from the *Journal of Electrochemical Society Solid State Science,* September 1970, pp 1194 through 1196. These earlier works teach the incorporation of dopants such as indium and boron to improve crystal structure and particularly to minimize dislocation density. The fabrication of gallium arsenide single crystal by liquid encapsulated Czochralski growth processes is associated with severe thermal stresses which tend to produce high dislocation densities, typically in the $10^4$ to $10^5$ $cm^{-2}$ range, which limit the use of gallium arsenide crystals as subtrates for field effect transistor fabrication. The effects of high dislocation defects in gallium arsenide substrates upon the field effect transistors formed therein are reported by several recent articles, "Direct Observation of Dislocation Effects on Threshold Voltage of a GaAs Field Effect Transistor," by S. Miyazawa et al., from *Applied Physics Letters,* Nov. 1, 1983, "Leakage Current $I_L$ Variation Correlated with Dislocation Density in Undoped, Semi-Insulating LEC-GaAs," by S. Miyazawa, published in *Japanese Journal of Applied Physics, Vol.* 21, No. 9, September 1982, pp. L542–L544, "Correlation between Disclocation Distribution and FET Performances Observed in Low Cr Doped LEC GaAs," by Y. Nanishi, published in the *Japanese Journal of Applied Physics,* Vol. 22, No. 1, January 1983, pp L54–L56.

In prior art techniques for growing gallium arsenide it has been found difficult to maintain the desired stoichiometric ratio which provides good electrical characteristics, and the yield of crystals with the desirable characteristics is low.

It is also well known that to ensure semi-insulating electrical behavior in gallium arsenide single crystal material, the ratio of gallium to arsenic in the melt must be carefully controlled tp achieve large diameter crystals exhibiting uniform N-type high resistivity over the full crystal length with the most desirable composition corresponding to a slightly arsenic rich melt.

The desired electrical characteristics of semi-insulating gallium arsenide useful for integrated circuit applications exhibits a high resistivity as well as high mobility. This material is typically used as a substrate with silicon ion-implanted as an active surface layer permitting fabrication of semiconductive devices.

As is well understood, the grown crystal is sliced into wafers which are then processed to form the semiconductive devices. Such gallium arsenide crystals and wafers exhibit a lattice structure which is subject to fracturing during fabrication handling of the wafers. It is desired to strengthen this lattice structure.

In other applications gallium arsenide is used in optoelectronic devices as a substrate with thin ternary films of, for example, gallium-aluminum-arsenide epitaxially grown on such substrate. The lattice parameters of the substrate and the deposited film are generally mismatched, giving rise to misfit dislocations at the interface of the substrate and the film.

SUMMARY OF THE INVENTION

Indium doped gallium arsenide semi-insulating single crystals, and a method of fabrication therefor, have been provided wherein the crystal exhibits substantially reduced dislocation density and stable semi-insulating resistivity. The resultant gallium arsenide large diameter substrates produced from such crystals are thus highly suitable for device fabrication technology, such as microwave linear and digital logic integrated circuit applications, which require high quality semi-insulating gallium arsenide substrates. The inclusion of elemental indium along with elemental gallium and arsenic has been found to produce grown crystals with the desired stoichiometry exhibiting the desired semi-insulating electrical characteristics with high yield.

The indium doped gallium arsenide produced by the present invention has a strengthened lattice which reduces wafer fracturing during handling, minimizes wafer warpage during thermal processing, and minimizes misfit dislocations between the wafer and epitaxially grown films.

It has been discovered that in liquid encapsulated Czochralski crystal growth of indium doped gallium arsenide, the segregation coefficient of indium with respect to gallium arsenide is about 0.1, which is substantially higher than hereto thought. This relatively high segregation coefficient permits growth of long, uniformly indium-doped crystals of large diameter with crystal structure of high quality.

DESCRIPTION OF THE PREFERRED EMBODIMENTS

Figure 1:
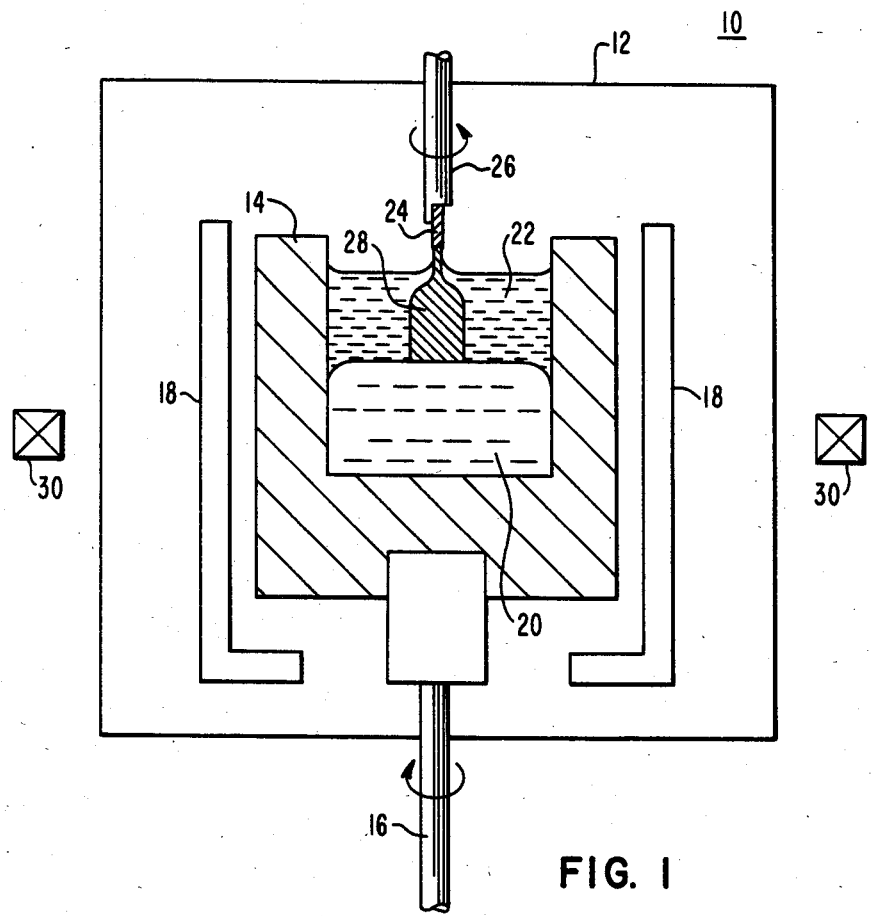
FIG. 1 is a schematic illustration of a liquid encapsulated Czochralski crystal growth system.

The indium doped gallium arsenide crystals of the present invention are grown using a liquid encapsulated Czochralski (LEC) fabrication technique in which crystals of up to about 6 inches length were grown with a diameter from 50 to 75 millimeters. The crystals are grown in the (100)-orientation from stoichiometric or slightly arsenic rich melts contained in a pyrolytic boron nitride crucible using a high-pressure Melbourn LEC crystal puller. The indium, gallium, and arsenic are provided in elemental form, and in situ melting and crystal pulling proceeds as illustrated in FIG. 1. The indium is incorporated into the melt at a doping concentration of approximately one atom percent. Crystal growth is initiated from undoped gallium arsenide seed crystals under conditions of counterrotation of the seed crystal at approximately 6 revolutions per minute and the crucible at approximately 30 revolutions per minute. Pull rate in the 5 to 10 millimeters per hour range with axial thermal gradients of 100 to 150 degrees per centimeter were utilized. A high-pressure inert argon atmosphere at approximately 300 pounds per square inch is maintained above the melt.

The indium doping concentration in the resultant crystals was determined to be $5 \times 10$ atoms per cubic centimeter to about $3 \times 10^{20}$ atoms per cubic centimeter as determined by X-ray microprobe analysis. From analyses of the indium content as a function of the melt fraction solidified, an effective segregation coefficient of 0.1 for indium in gallium arsenide has been determined.

The dislocation density for the indium-doped gallium arsenide crystal of the present invention has been determined by molten potassium hydroxide etch-pit studies and reflection X-ray topography analysis. It has been determined that 50 mm diameter crystals grown by means of the present invention exhibit virtually dislocation-free areas covering up to 75 percent of the crystal diameter, with the dislocation density being only 100 to 400 per square centimeter. By contrast, undoped gallium arsenide crystals grown by prior art techniques exhibit dislocation densities in the $10^4$ to $10^5$ per square centimeter range.

The invention can be perhaps best understood by reference to the FIG. 1 schematic illustration of the liquid encapsulated Czochralski crystal growth system. The system 10 includes a sealed enclosure 12 in which a high inert ambient pressure is maintained. A crucible 14 of high purity pyrolytic boron nitride is supported from the rotary and axially movable drive shaft 16 which is sealed with the enclosure 12. A heating means 18 is disposed about the crucible 14 for controlling the temperature of the melt and the temperature gradient during the crystal cooling operation. The indium, gallium, and arsenic are introduced in elemental form and are seen as a melt 20 disposed within crucible 14. The liquid inert encapsulant 22 of boric oxide covers the melt 20. The boric oxide encapsulant is of high purity and has a water content of between 100 and 500 parts per million based on weight. A crystallographically oriented seed crystal 24 of gallium arsenide is supported from upper drive shaft 26 which is also rotatable and axially movable. The indium-doped gallium arsenide single crystal 28 is seen emerging from the melt 20 and the liquid encapsulated layer 22 as a result of moving the seed crystal axially upward with time. Magnetic field means 30 may be disposed about the enclosure 12 to provide a magnetic field of, for example, about 2000 gauss preferably directed along the crystal pull axis. Application of such magnetic field during pulling of the crystal minimizes localized concentrations of the indium which otherwise appear as striations swirling through the crystal. The magnetic field may also be transverse to the crystal axis while promoting uniform distribution of the indium through the crystal.

Figure 2:
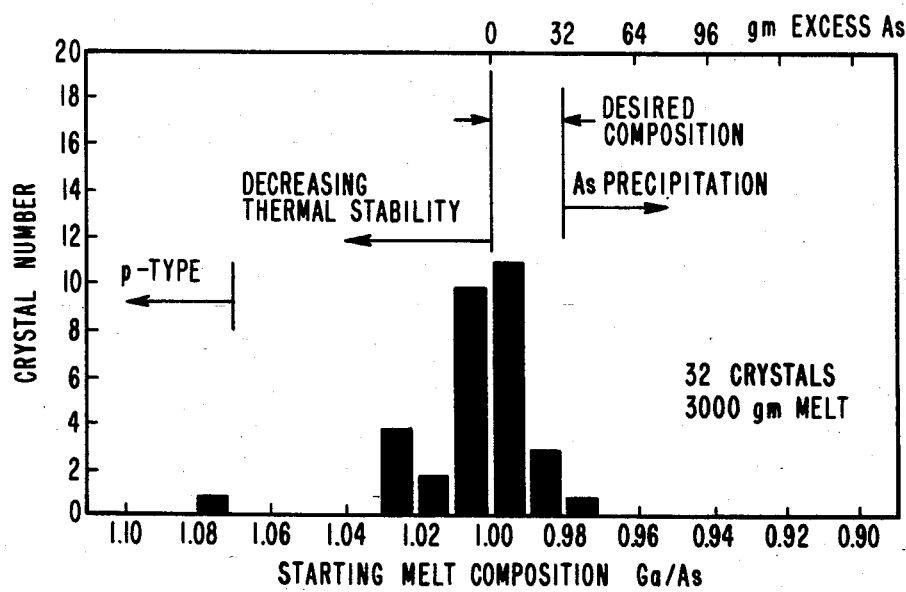
FIG. 2 is a plot of the melt composition range for undoped gallium arsenide, which illustrates the number of acceptable crystals grown having the desired stoichiometry. The number of crystals is plotted against the starting melt composition ratio of gallium to arsenic.
Figure 5:
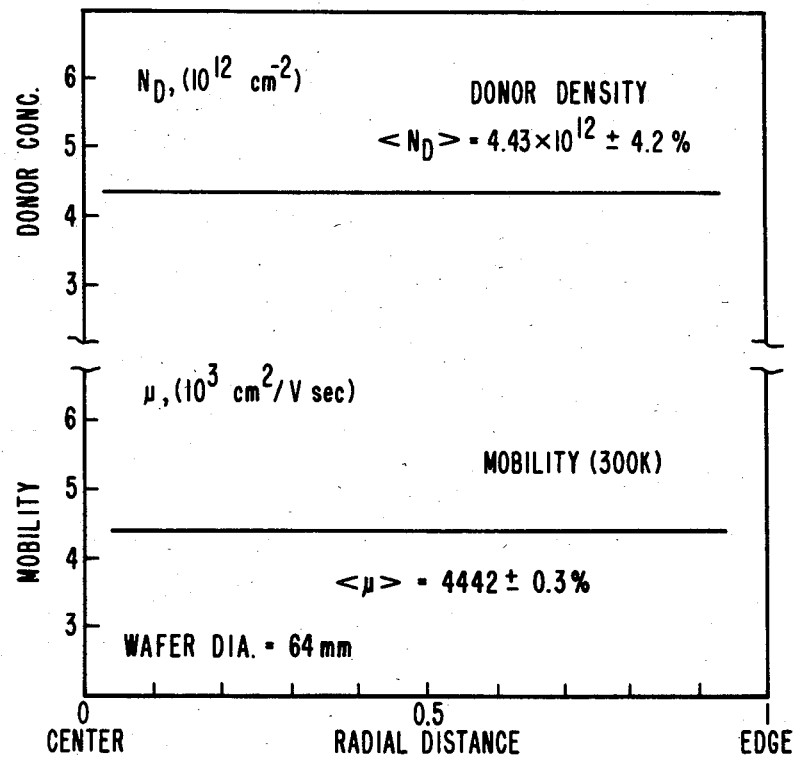
FIG. 5 is a plot illustrating the mobility and donor concentration plotted on one axis against radial distance measured from the center to the edge of an indium doped gallium arsenide wafer of the present invention to illustrate radial uniformity of electrical properties resulting from the device fabrication step of ion-implantation.

FIG. 2 illustrates the melt compositional range corresponding to the desired compositions which have been found to be useful in the prior art for fabricating integrated circuit devices. In FIG. 2 the starting melt compositional ratio of gallium to arsenic is plotted along the lower horizontal axis, while the gram excess of arsenic over stoichiometric mixture in the melt is plotted on the upper horizontal axis. A slight excess of arsenic over the stoichiometric ratio with respect to gallium present is preferred in the melt. The number of crystals having a particular composition out of a total of 32 crystals is plotted on the vertical axis. Crystals exhibiting uniform N-type high resistivity over the full crystal length and useful for integrated circuit device fabrication are obtained only from a narrow compositional window as seen in FIG. 2; i.e., with a melt ratio of gallium to arsenic of about 0.98 to 1, corresponding to crystals with both high resistivity and high N-type Hall mobility. This figure indicates that crystals found to be desirable for integrated circuits must be grown from a slightly arsenic rich melt composition. The desired N-type semi-insulating gallium arsenide produced by prior art processes, as illustrated in FIG. 2 was had by inclusion in a 3000 gram melt of up to about 32 gram excess of arsenic over the stoichiometric amount to compensate for arsenic which evolves from the melt. As can be seen, the yield of desirable composition crystals is relatively low, only about 14 crystals out of 32.

It has been observed that the addition of indium, in elemental form of the gallium and arsenic constitutents reduces the loss of arsenic during the synthesis of indium-doped gallium arsenide melts, and thereby yields crystals with more optimum arsenic rich compositions. This can be seen in the data of Table 1 below, where the starting melt compositions for several indium-doped crystal growths were measured by a weight-in/weight-out technique.

The data presented in Table 1 demonstrates that with the inclusion of elemental indium the starting melt composition ratio can be determined to be within the desired approximate stoichiometric or slightly arsenic rich ratio. This means that the yield of crystals with the desirable electrical characteristics of high resistivity and mobility is significantly improved.

The data of Table 1 demonstrates that increasing the indium concentration in the synthesized melt composition increases the arsenic richness in the gallium arsenide melt composition relative to gallium.

TABLE 1

VARIATION OF STARTING MELT COMPOSITION WITH INDIUM DOPING

| Indium Content of Melt (mole fraction) | Starting [Ga/As] Melt Composition | Starting III/V Melt Composition |
|---|---|---|
| 0.00759 | 1.002 | 1.0173 |
| 0.00763 | 0.999 | 1.0146 |
| 0.00975 | 0.964 | 0.9830 |
| 0.00979 | 0.959 | 0.9790 |
| 0.01010 | 0.986 | 1.0064 |
| 0.01946 | 0.943 | 0.9810 |

The data presented above indicates that the starting composition of the melt is shifted toward the arsenic rich side as the indium content increases (arsenic rich relative to gallium). The ratio of Group III to Group V constituents is maintained at about the stoichiometric III/V ratio of approximately 1.

Figure 3:
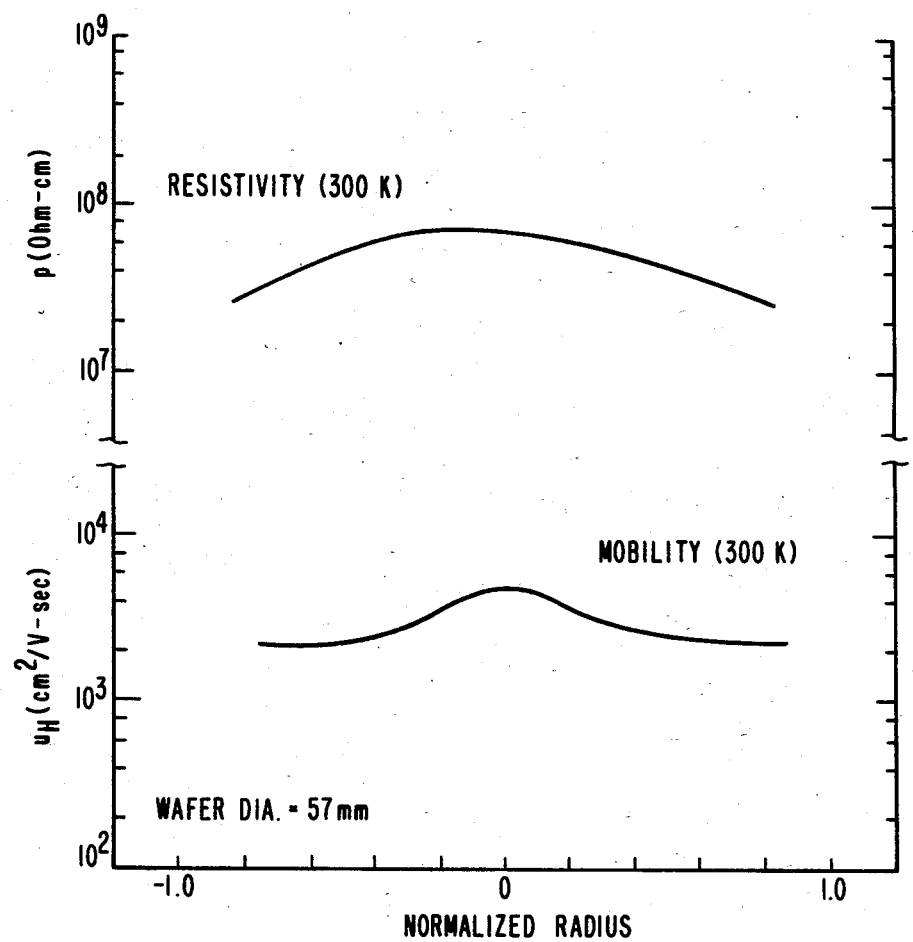
FIG. 3 is a plot of the resistivity and mobility for the indium doped gallium arsenide crystals of the present invention, with the mobility and resistivity plotted along a common axis against the normalized radius along the other axis.

It has been discovered that impurity doping with indium under the described fabrication conditions can be used to reduce dislocation densities in gallium arsenide substrates without degrading the semi-insulating properties of the substrate. In FIG. 3 the as-grown resistivity and mobility characteristics across a 57 millimeter diameter indium-doped gallium arsenide substrate are plotted. In this substrate the indium concentration is about $5 \times 10^{19}$ atoms per cubic centimeter. As-grown resistivities in the $10^7$ to $10^8$ ohm-centimeter range comparable to undoped LEC grown gallium arsenide crystals are observed, and are completely adequate for device fabrication. As-grown mobilities in excess of 5000 cm$^2$ per volt-second and comparable to undoped substrates are observed in the low dislocation density central region of the indium-doped slice.

Figure 4A:
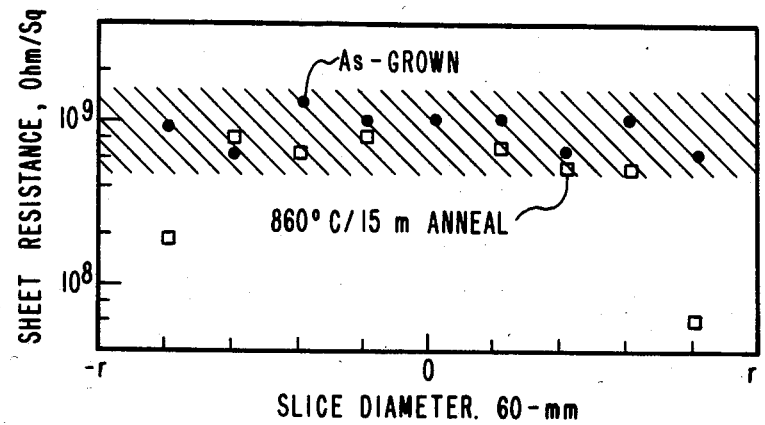
FIG. 4A is a plot illustrating the thermal stability of the indium doped gallium arsenide crystal of the present invention in which sheet resistance in ohms per square is plotted against radius of the wafer, with the resistance being shown corresponding to the as-grown state by the dots, and after a high temperature annealing step used in device fabrication (by the squares).
Figure 4B:
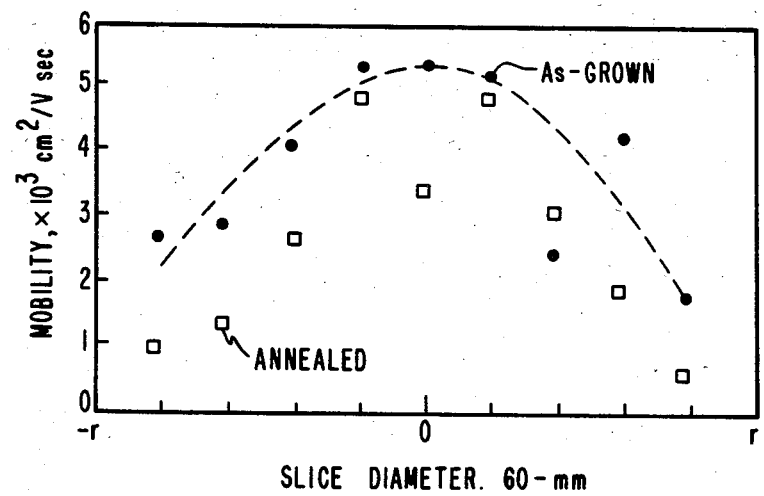
FIG. 4B is a plot illustrating mobility plotted against wafer radius for as-grown substrates by the dots and after annealing by the squares.

FIG. 4A shows that semi-insulating sheet resistance is maintained in the indium-doped substrate after standard implantation thermal annealing at about 800 degrees centigrade for 15 minutes. The data exhibit the same features as observed in the as-grown slice, except for somewhat reduced mobility at the slice center. Such a reduced mobility characteristic is also typically observed in annealed undoped LEC grown substrates. FIG. 4B shows the radial uniformity of silicon implant properties in a 64 millimeter diameter indium-doped substrate of the present invention in which the implanted donor density of $4.4 \times 10^{12}$ per square centimeter displays a variation of 4.2 percent. Mobilities of $4442 \pm 0.3$ percent across the wafer are also observed. The observed uniformities for this implant concentration are approximately equivalent to those typically observed in undoped LEC grown substrates.

It has been demonstrated that indium is an effective doping agent for reduction of dislocations in LEC grown gallium arsenide. In addition, indium behaves as a benign Group III impurity and does not impair or degrade the electrical properties and implantation characteristics of the substrates.

The indium doped gallium arsenide crystals of the present invention as produced by the present high yield process exhibit the desired high resistivity, high mobility electrical characteristics which permit fabrication of high quality microwave and digital logic devices. The grown crystal has a strengthened lattice due to inclusion of the indium to minimize warpage and misfit dislocations with epitaxially grown films.

The amount of elemental indium present in the initial melt may be present in an amount of 1 to 2 atom percent of the gallium arsenide.

We claim:

1. A method of fabricating a large diameter, long single crystal of semi-insulating, indium-doped gallium arsenide which exhibits low dislocation structure, which crystal is grown by liquid encapsulant Czochralski processing comprising:
   (a) providing an initial melt of elemental gallium, indium, and arsenic, in which the indium is present in an amount of about 1 to 2 atom percent of the gallium and arsenic, with a slight excess of arsenic over a stoichiometric ratio with respect to gallium present;
   (b) heating the initial melt to form indium-doped gallium arsenide and maintaining a predetermined thermal gradient characteristic in the melt along the axial direction of crystal pull;
   (c) pulling at a predetermined rate a single crystal of indium-doped gallium arsenide from the fluid melt, forming the crystal at the melt face with the indium concentration being about $5 \times 10^{19}$ to $3 \times 10^{20}$ indium atoms per cubic centimeter which is uniformly distributed through the single crystal with the segregation coefficient of indium in gallium arsenide being about 0.1, with the ratio of gallium and indium to arsenic being approximately stoichiometric.

2. The method set forth in claim 1, wherein the axial temperature gradient at the crystal forming face is less than about 150 degrees Centigrade per centimeter, and the pull rate is about 6 mm per hour.

3. The method set forth in claim 1, wherein the liquid encapsulant is boric oxide having a water content of about 100–500 parts per million weight, and the melt is disposed in a high purity pyrolytic boron nitride crucible, with an argon ambient pressure of about 300 pounds per square inch maintained above the boric oxide liquid encapsulant.

4. The method set forth in claim 1, wherein a magnetic field is generated in the crystal during pulling of the crystal to promote uniform distribution of the indium through the grown crystal.

5. A large diameter, long single crystal of semi-insulating indium-doped gallium arsenide exhibiting a low dislocation structure, which crystal is grown by liquid encapsulant Czochralski processing in which the gallium, indium, and arsenic are supplied in elemental form in the starting melt, with the indium present in the melt in an amount of about 1 to 2 atom percent of the gallium arsenide, with a slight excess of arsenic over a stoichiometric ratio with respect to gallium present in the starting melt, and the single crystal having an approximately stoichiometric ratio of gallium and indium to arsenic, and an indium concentration of approximately $5 \times 10^{19}$ to $3 \times 10^{20}$ indium atoms per cubic centimeter.

6. A method of fabricating a large diameter, long single crystal of semi-insulating, indium-doped gallium arsenide which exhibits low dislocation structure, which crystal is grown by liquid encapsulant Czochralski processing comprising:
   (a) providing in a high purity pyrolytic boron nitride cruicible an initial melt of elemental gallium, indium, and arsenic, in which the indium is present in an amount of about 1 to 2 atom percent of the gallium and arsenic, with a slight excess of arsenic over a stoichiometric ratio with respect to gallium present;

(b) providing a liquid encapsulant of boric oxide having a water content of about 100–500 parts per million weight within the boron nitride crucible covering the initial melt of elemental gallium, indium, and arsenic;

(c) maintaining an inert gas overpressure of about 300 pounds per square inch above the boric oxide liquid encapsulant;

(d) heating the initial melt to form indium-doped gallium arsenide and maintaining a predetermined thermal gradient characteristic in the melt along the axial direction of crystal pull in order to form the crystal at the melt face and wherein the axial temperature gradient at the crystal forming face is from about 100 to 150 degrees Centigrade per centimeter, and the pull rate is about 5 to 10 mm per hour;

(e) rotating a gallium arsenide seed crystal which is disposed within the melt while rotating the crucible containing the melt in the opposed direction;

(f) pulling at a predetermined rate a single crystal of indium-doped gallium arsenide from the fluid melt, with the indium concentration being about $5 \times 10^{19}$ to $3 \times 10^{20}$ indium atoms per cubic centimeter which is uniformly distributed through the single crystal with the segregation coefficient of indium in gallium arsenide being about 0.1, with the ratio of gallium and indium to arsenic being approximately stoichiometric.

* * * * *